United States Patent [19]

Theus et al.

[11] Patent Number: 5,446,380
[45] Date of Patent: Aug. 29, 1995

[54] MONOLITHIC INTEGRATED VOLTAGE REGULATOR

[75] Inventors: Ulrich Theus, Gundelfingen; Juergen Kessel, Freiburg, both of Germany

[73] Assignee: Deutsche ITT Industries GmbH, Freiburg, Germany

[21] Appl. No.: 164,188

[22] Filed: Dec. 9, 1993

[30] Foreign Application Priority Data

Dec. 18, 1992 [DE] Germany ............... 42 42 989.7

[51] Int. Cl.$^6$ ................................ G05F 1/565
[52] U.S. Cl. ........................ 323/275; 323/277; 323/280; 323/901
[58] Field of Search ............. 323/273, 274, 275, 277, 323/280, 281, 901

[56] References Cited

U.S. PATENT DOCUMENTS

| | | | |
|---|---|---|---|
| 3,401,335 | 9/1968 | Perkinson | 324/76 |
| 3,549,983 | 12/1970 | Sprogis | 323/22 |
| 4,754,386 | 6/1990 | De Weerd | 363/21 |
| 4,952,867 | 8/1990 | Anderson et al. | 323/273 |
| 5,182,525 | 1/1995 | Theus | 330/253 |

FOREIGN PATENT DOCUMENTS

| | | |
|---|---|---|
| 0199427 | 1/1986 | . |
| 0460263 | 12/1991 | European Pat. Off. . |
| 0491980 | 7/1992 | European Pat. Off. . |
| 3010618 | 9/1981 | Germany . |
| 2034937 | 11/1978 | United Kingdom . |

*Primary Examiner*—Steven L. Stephan
*Assistant Examiner*—Shawn Riley
*Attorney, Agent, or Firm*—Thomas L. Peterson

[57] ABSTRACT

A voltage regulator in the form of a series regulator for generating a regulated supply voltage includes a control loop with a reference network, a difference device, and a control element. The control element is connected between a first terminal and a second terminal. The power supply for the reference network and the difference device is coupled to the second terminal. During a starting phase, a starting device with an auxiliary circuit pulls the control loop into the regular operating range.

13 Claims, 4 Drawing Sheets

MONOLITHIC INTEGRATED VOLTAGE REGULATOR

BACKGROUND OF THE INVENTION

The present invention relates to a voltage regulator comprising a control loop for generating a regulated supply voltage.

SUMMARY OF THE INVENTION

The voltage regulator operates as a series regulator whose control element is located between a first terminal, to which an unregulated supply voltage is applied, and a second terminal, which provides the regulated supply voltage. A third terminal connects the voltage regulator to a fixed reference potential, such as a ground potential. The loop contains, in the direction of signal flow, a reference network which provides the signals for the set-point/actual-value comparison, a difference device having a first gain which generates a signal dependent on the deviation, and the control element, which has a second gain.

Such a voltage regulator is described, for example, in European Patent Application EP-A 0 491 980. It is a CMOS voltage regulator whose regulated output voltage feeds signal-processing circuits which are monolithically integrated on the semiconductor surface.

A disadvantage of the voltage regulator disclosed in EP-A 0 491 980 is that the individual stages of the loop, which are supply-voltage-independent only to a limited extent, are connected to the unregulated supply voltage. Interference signals on the supply line, such as voltage spikes or high-frequency interference signals, as may occur, for example, in the on-board system of a motor vehicle, will thus affect the regulated output voltage. This effect will increase if the output voltage is buffered not by external, large filter means, but by relatively small, integrated capacitors, if at all.

SUMMARY OF THE INVENTION

It is, therefore, the object of the invention as claimed to provide a monolithic integrated voltage regulator which is insensitive to interference signals on the unregulated supply voltage.

This object is attained by connecting as many stages of the control loop as possible to the regulated supply voltage and ensuring by means of a starting device that upon every start-up, all stages are safely pulled into their operating range.

The invention and further advantages thereof will now be explained in more detail with reference to the accompanying drawings.

DETAILED DESCRIPTION OF THE PREFERRED EMBODIMENT

Figure 1:
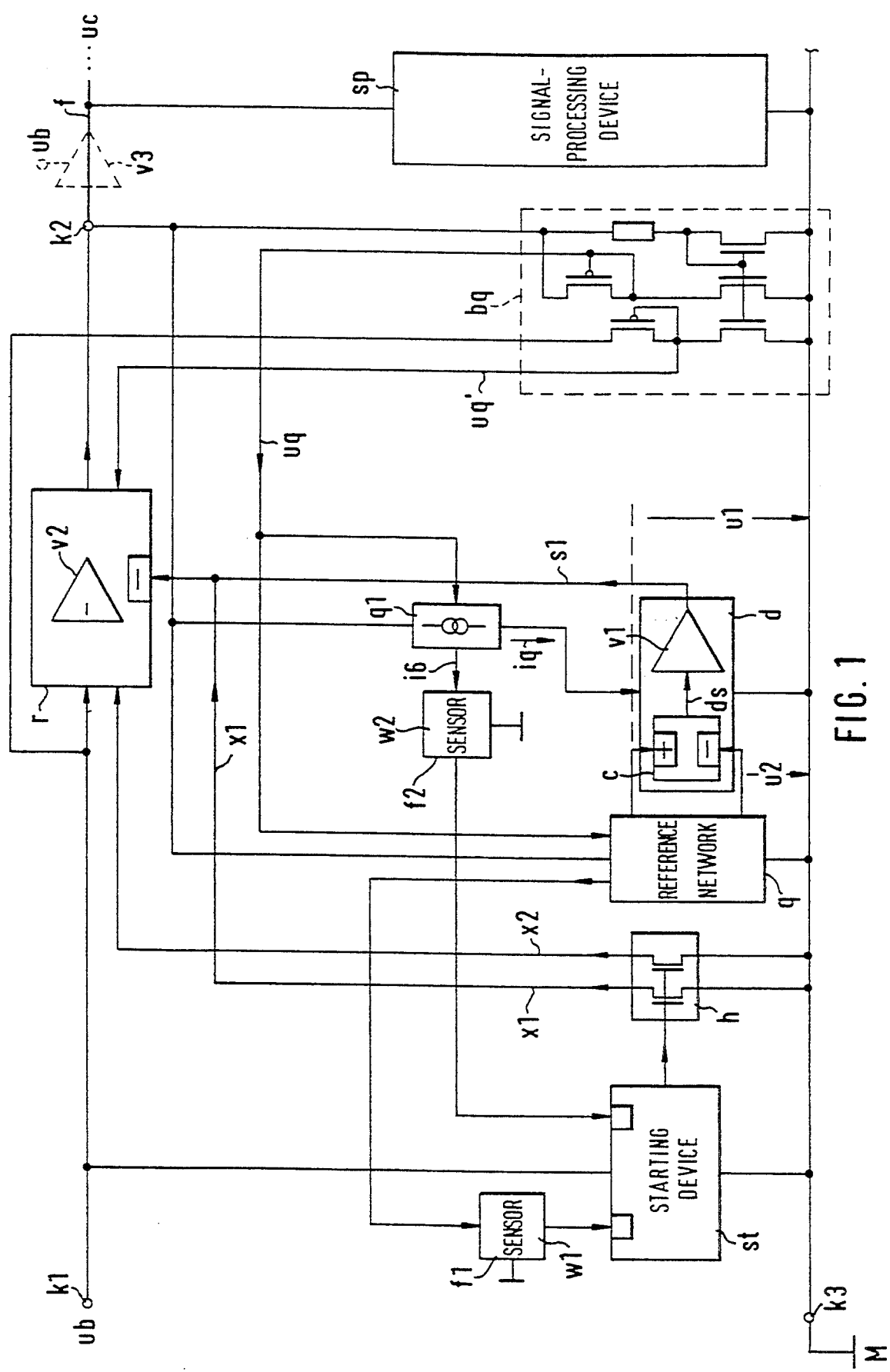
FIG. 1 is a block diagram of one embodiment of the voltage regulator in accordance with the invention.

The controlled system of the voltage regular shown in the block diagram of FIG. 1 lies between a first terminal k1 and a second terminal k2. The first terminal k1 has an unregulated supply voltage ub applied to it, and the second terminal k2 provides a regulated supply voltage uc. A second amplifier v2, whose inverting input is supplied with an actuating signal s1 (see FIG. 3), serves as a control element r between the first and second terminals. The advantage of the use of the second amplifier v2 over a single transistor is that the unregulated supply voltage is less able to reach the second supply terminal k2. If the second amplifier v2 also has a push-pull output, the internal resistance of the voltage regulator will be approximately equally low for both output-current directions. For higher output powers, the voltage regulator is followed by a power stage v3, which may be implemented with an impedance transformer, for example.

A reference potential M, usually ground potential, is connected to a third terminal k3 of the voltage regulator. A circuit block sp is connected between the impedance-transformer output or the second terminal k2 and the third terminal k3. The circuit block sp represents a plurality of analog and/or digital signal-processing devices that are fed with the regulated supply voltage uc via an internal supply line f. Particularly advantageously, the voltage regulator and the signal-processing devices sp are integrated on the same semiconductor surface. The signal-processing devices sp can then be fabricated in standard CMOS technology in a simple manner, for example, via circuit libraries, with the circuit design and the fabrication process being optimized for the value of the regulated supply voltage uc. The unregulated, higher supply voltage ub only needs to be taken into account in the design of the voltage regulator at a few points.

Figure 2:
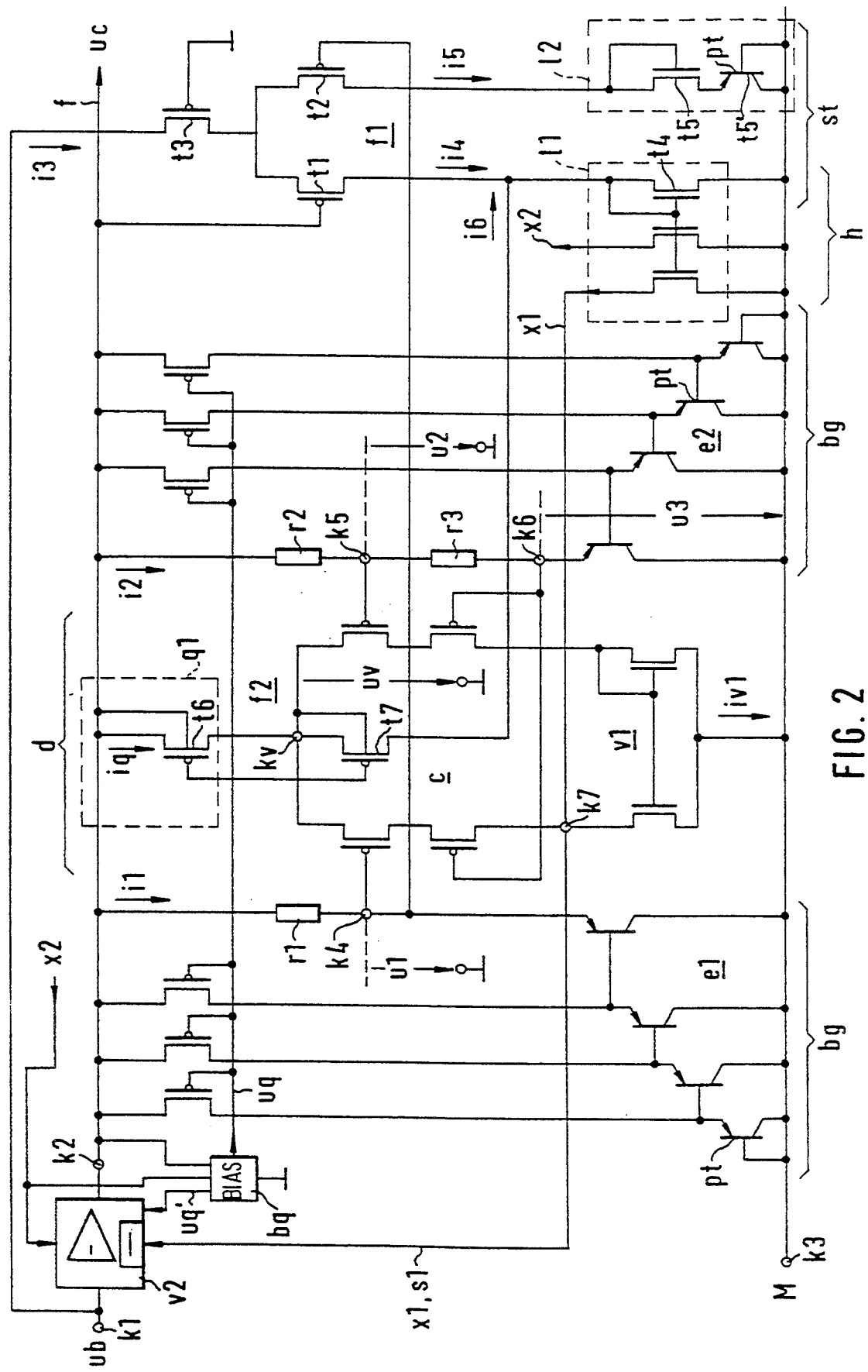
FIG. 2 illustrates a preferred embodiment of a few stages of the voltage regulator.

The control loop of the voltage regulator of FIG. 1 contains a reference network q; a difference device d, which comprises a difference stage c and a first amplifier v1; and the second amplifier v2. The difference stage c forms a difference signal ds as a measure of the deviation. The difference stage c forms the difference signal ds from a first voltage u1 and a second voltage u2, which are provided by the reference network q. The voltage u1 can be derived, for example, by means of a diode section, a breakdown section or a bandgap circuit. The second voltage u2 is derived in the simplest case from the regulated supply voltage uc by means of a resistive voltage divider. In the embodiment of FIG. 2, the bandgap circuit delivers a first voltage u1 and a second voltage u2 which are dependent on the regulated supply voltage uc and have different characteristics. The intersection of the two characteristics is directly dependent on the set point for the control loop. The first amplifier v1 in FIG. 1 is supplied at its input with the difference signal ds from the difference stage c and provides at its output the actuating signal s1. Frequency-dependent negative feedback in the second amplifier stabilizes the control loop. The implementation of the individual stages is not confined to the embodiments, neither in the circuit technology nor in the fabrication process.

In FIG. 1, a bias source bq is shown in simplified form. Its control input is connected to the regulated supply voltage uc, and its outputs provide a first bias voltage uq and a second bias voltage uq'. With the bias voltage uq, it is possible, for example, to set the bias of a p-channel current bank (see FIG. 2) which delivers constant and defined currents. The bias voltage uq', which is linked with the unregulated supply voltage ub, activates a current source in the second amplifier (see FIG. 3).

It is apparent that by the connection of the individual stages to the regulated supply voltage uc, the interference characteristic is improved. For the steady state, this connection presents no problems. Things are different, however, when the voltage regulator starts from the deenergized condition. In this staring phase, it must be ensured that the regulated supply voltage uc, which is initially still at the reference potential M, increases as rapidly as possible and reaches the normal operating range. In the starting range, the correct direction of control is by no means ensured. The individual stages of the control loop either are still completely deenergized or are not yet operating correctly. The situation is even worse if in the starting range the direction of control is inverted, because then the voltage regulator can never reach its regular operating range.

According to the invention, this difficulty is overcome by a starting device st which is connected between the first and third terminals k1, k3 and is so designed that at the application of the unregulated supply voltage ub, a shunt current can flow through the starting device. The shunt current activates an auxiliary circuit h which pulls the control loop into the regular operating range. Starting devices are also known, for example, in connection with microprocessors under the term "power-on reset circuits", which, at the applications of the supply voltage, bring particular registers for logic switching stages into a defined state. The implementation of starting devices may differ widely—they may be controlled either via internal timing elements or via switching thresholds with which voltages or currents are monitored in the starting range.

For a voltage regulator, in view of the varying load conditions, the monitoring of voltages or currents is preferable to a timing scheme. This monitoring is accomplished in FIG. 1 by means of a first sensor f1 which monitors a current in the reference network and activates the starting device st as long as this current is still low, and thus indicates that the reference network is not yet in the regular operating range.

The starting behavior of the control loop can be further improved if a further subcircuit of the control loop is monitored via a second sensor f2. In FIG. 1, this further subcircuit is the difference device d, which is supplied with a current iq from a current source q1 (see also FIG. 2), for example. As long as the difference device d is not yet in the regular operating range, at least part of this current iq or a current i6 linked therewith is supplied to the second sensor f2. The second sensor f2 activates the starting device st via this current i6 as long as the difference device d cannot yet take the applied current iq.

The first sensor f1 and the second sensor f2 define a first starting phase p1 and a second starting phase p2, respectively, which are terminated when a first switching threshold w1 and a second switching threshold w2, respectively, are exceeded. The first and second starting phases p1, p2 cover the whole starting range of the regulated supply voltage uc (see also FIGS. 5 and 6).

Figure 3:
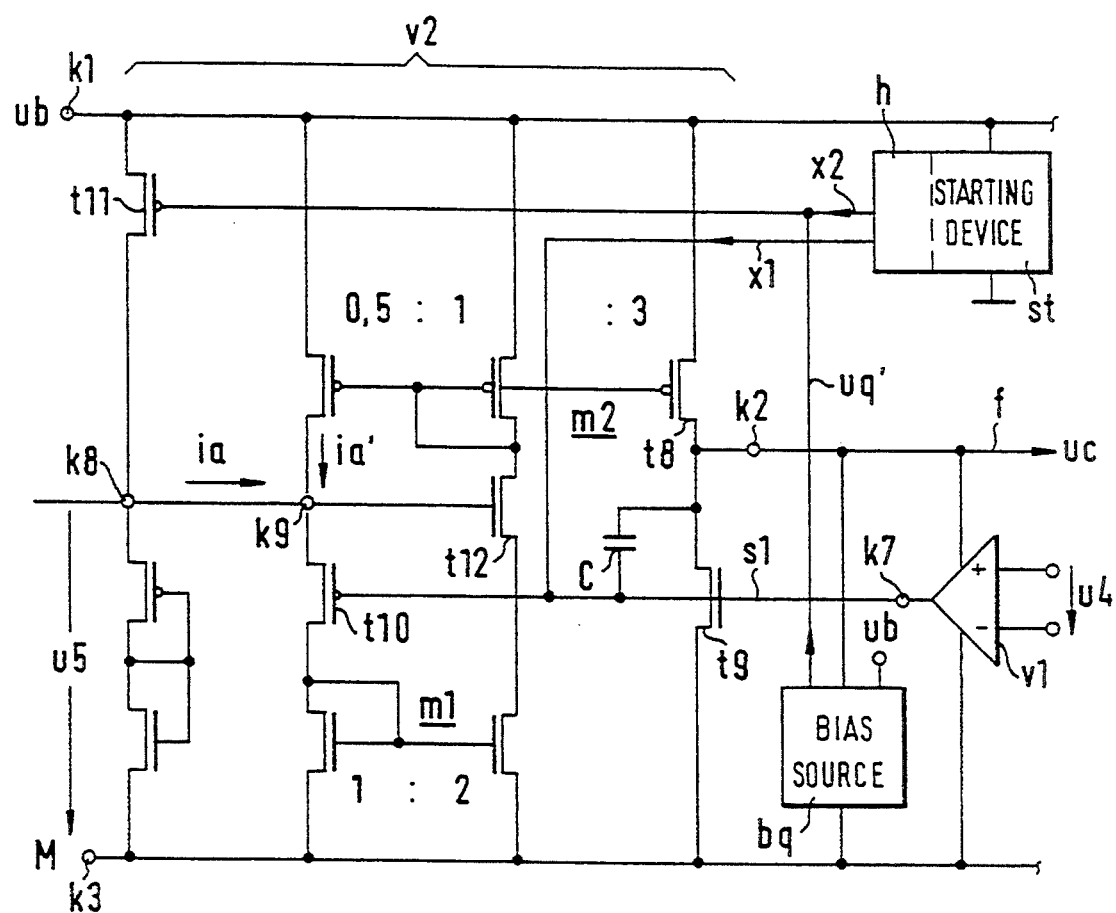
FIG. 3 illustrates a CMOS transconductance amplifier as a preferred embodiment of the control element.

During the starting phase, the starting device st activates the auxiliary circuit h, which generates a first auxiliary signal x1 and a second auxiliary signal x2 to pull the control loop into the regular operating range. The first auxiliary signal x1 pulls the inverting control input of the second amplifier v2 toward ground potential M, thus causing the output potential of the amplifier to rise. It is assumed here that the second amplifier is in the active operating range. In the embodiment of FIG. 3, this is only the case if a current source t11 is simultaneously activated by means of the second auxiliary signal x2. The auxiliary circuit h may generate further auxiliary signals or bias voltages which are also used in other stages of the control loop.

FIG. 2 illustrates a particularly advantageous embodiment of the reference network q, the difference stage c, the first amplifier v1, the first and second sensors f1, f2, the starting device st, and the auxiliary circuit h in a more detailed diagram. The reference network q is designed as a fourfold bandgap circuit bg, which also provides the first and second voltages u1, u2 for determining the deviation. The difference stage c and the first amplifier v1 together represent the difference device d. By as symmetrical a design of the bandgap circuit bg as possible, namely in the form of two very similar subcircuits, high interference rejection is provided.

A first portion of the bandgap circuit bg contains four series-connected base-emitter sections of substrate pnp transistors pt whose respective emitter areas are determined by a value e1 preset by the circuit design. A second portion of the bandgap circuit bg is also formed by four series-connected base-emitter sections of four additional substrate pnp transistors pt whose respective emitter areas are determined by a second value e2. In the example assumed here, e2 is twelve times the value of e1. If all substrate pnp transistors are fed with the same emitter current (of, for example, 20 microamperes), a given voltage will appear at the emitter of the respective substrate pnp transistor connected to the highest voltage level. For the bandgap portion with the emitter areas e1 and e2, these are the first voltage level u1 and a third voltage level u3, respectively, which can be tapped off a fourth node k4 and a sixth node k6, respectively. The respective voltage level follows from the different emitter areas e1, e2 and the series connection of the four substrate pnp transistors pt according the following known relationship:

$$u1 - u3 = 4 \times k \times T \times 1/e \times \ln(e2/e1)$$

where
k = Boltzmann's constant
T = absolute temperature
e = elementary charge

In the embodiment of FIG. 2, at room temperature, the third voltage level u3 is approximately 256 millivolts lower than the first voltage level u1.

As is well known, the operation of the bandgap circuit consists in the fact that the negative temperature coefficient of the base-emitter sections is compensated for by the positive temperature coefficient of a voltage which is proportional to the emitter-area-dependent difference voltage u1 − u3. To be exact, to a voltage with a negative temperature coefficient (absolute value) is added a given voltage value whose temperature coefficient (absolute value) is opposite, but equal in magnitude. This voltage value is generally formed by applying the emitter-area-dependent difference voltage to a voltage-to-current converter realized by changing the current flowing through a resistor. The voltage difference across the resistor thus has the same temperature coefficient as the emitter-area-dependent difference voltage. The value of the resistor must be so large that the absolute voltage value necessary for compensation is precisely met. In the embodiment of FIG. 2, this is achieved by the voltage drop across a resistor r1 caused by a current i1 or by the voltage drop across a resistor series combination of a resistor r2 and a resistor r3 caused by a current i2. The regulated supply voltage uc is thus the temperature-stabilized bandgap voltage proper. In the example assumed hereinabove, where i1=i2=20 microamperes, the resistors r1 and r2 each have a value of 115 kiloohms, and the resistor r3 has a value of 12.8 kiloohms.

Since in the desired condition the two bandgap currents i1, i2 are equal in magnitude, the voltage u1 at the node k4, and the voltage u2 at a node k5 between the resistor r2 and the resistor r3 are also equal, so that the voltage comparison in the control loop only requires a simple difference measurement u1−u2. The slopes of the characteristics of the two voltages u1, u2 as a function of the voltage uc are different, but the two characteristics intersect at a value of approximately 2.7 volts, so that the voltage uo has a value of approximately 5 volts (see also FIG. 4). By means of the loop, the output voltage uc of the bandgap circuit bg is readjusted until the voltage difference u1−u2 becomes zero. The regulated supply voltage uc then has the desired value of approximately 5 volts.

The difference device d of FIG. 2 is implemented with a differential amplifier 6, v1 with an active load. The differential input is formed by a p-channel transistor pair whose gate electrodes are connected to the fourth and fifth nodes k4 and k5, respectively, and whose common source terminal is supplied with the operating current iq from the p-channel current source q1. The output of the differential amplifier is formed by a seventh node k7 between the output of the active load and a p-channel transistor used in a cascode configuration. The seventh node k7 provides the actuating signal s1, which is fed to the inverting input of the second amplifier v2. The gate terminal of the current source q1 is connected to the same bias voltage uq as the p-channel transistors feeding the bandgap circuit bg.

The starting device st of FIG. 2 consists primarily of a current separator which is supplied with a current i3 from a p-channel transistor t3. The respective current path is controlled by a p-channel transistor pair t1, t2 which supplies most of the current i3 as a current i4 to a first load 11 during the first starting phase p1, and the whole current i3 as a current i5 to a second load 12 outside the starting phase. The first load 11 is a diode-connected n-channel transistor t4, and the second load 12 is a series combination of two diode sections. The first diode section is formed by an n-channel transistor t5, and the second diode section by a substrate pnp transistor t5' having its base and collector terminals connected to reference potential M.

The diode-connected n-channel transistor t4 also forms the input of the auxiliary circuit h, which is an n-channel current bank and delivers the first and second auxiliary signals x1, x2. The first auxiliary signal x1 pulls the seventh node k7, and thus the inverting input of the second amplifier v2, toward reference potential M. The second auxiliary signal x2 is applied to a bias-voltage input of the amplifier v2 and pulls the latter toward reference potential M as well (see FIG. 3). Thus, all necessary shunt current paths are turned on. In the starting phase, the first auxiliary signal x1 replaces the output signal s1 of the first amplifier v1.

The transistor pair t1, t2 of FIG. 2, whose gate electrodes are connected to the second and fourth nodes k2, k4, corresponds to the first sensor f1 of FIG. 1. In the early starting phase, both gate terminals are nearly at reference potential M, so that the current distribution is only dependent on the resistance ratio of the first and second loads 11, 12. Since the single diode section of the first load has a lower impedance than the series combination of the two diode sections in the second load, the applied current i3 flows mainly through the transistor t4 and thus activates the auxiliary circuit h. During the rise of the regulated supply voltage uc, a voltage difference will not appear between the second and fourth nodes k2, k4 until a current can flow in the bandgap circuit. Finally, the switching threshold w1 is reached and the transistor t1 is turned off. Then the whole current i3 flows off through the second load 12. This completes the first starting phase p1.

The portion of FIG. 2 corresponding to the second sensor f2 of FIG. 1, which monitors another operating current, is the series combination of two p-channel transistors t6 and tT. The transistor t6 in the current source q1 provides the operating current iq, which should flow as a current iv1 in the differential amplifier c, v1. In the starting phase, the source-drain section of the transistor t7 is in the unsaturated condition because the differential amplifier cannot yet take the operating current iq. Thus, the gate potential of transistor t7 is substantially lower than its drain potential uv at a node kv. This state is sensed by the p-channel transistor t7, whose gate and source electrodes are connected to the gate and drain electrodes, respectively, of the sixth transistor t6. Also connected to the drain electrode of the sixth transistor t6 is the n-type tub of the seventh transistor t7.

The saturation limit of the p-channel transistor t6 represents the second switching threshold w2, which is assigned to the second sensing device. As long as the transistor t6 is not in saturation, at least part of the operating current iq flows as a current i6 through the seventh transistor t7 into the input of the auxiliary circuit h and activates the latter. When the transistor t6 goes into saturation, the transistor t7 is turned off and the whole operating current iq flows into the differential amplifier c, v1. Thus, no activation current i6 is present for the auxiliary circuit h, so that the latter becomes inactive and terminates the second starting phase p2.

FIG. 3 illustrates a preferred embodiment of the second amplifier v2. It is a transconductance amplifier with a class-A/B push-pull output stage in CMOS technology. A nearly identical circuit is described in detail in EP-A-0 460 263. The amplifier v2 of FIG. 3 has two complementary branch circuits whose transconductances are set to equal values by suitable circuit design. The drive circuit ensures that the two branch circuits are driven by voltages of equal magnitude. This is achieved by driving both the gate terminal of an n-channel output transistor t9 and the gate terminal of a p-channel transistor t10 from the first amplifier v1. The source terminal of the transistor t10 is connected to a node k0 with a fixed potential u5, and the source terminal of the transistor t9 is at reference potential M. By means of an n-channel current mirror m1, the output current of the transistor t10 is mirrored and supplied to a p-channel current mirror m2 whose output transistor is an output transistor t8 of the class-A/B push-pull output stage. The drain electrodes of the eighth and ninth transistors t8 and t9 are connected together and form the second node k2. For the transconductances of the two complementary branch circuits to be equal at the operating point uc, the transistors, t9, t10 must also have the sane transconductance, taking into account that the two current mirrors m1, m2 have a transfer ratio other than 1.

A capacitor C of about 2 picofarads is connected between the second and seventh nodes k2, k7 for loop damping. The capacitor C can be readily integrated on the same semiconductor surface. This eliminates the need for an external component and the associated package lead.

In FIG. 3, the first amplifier v1 is fed by a difference voltage u4 which corresponds, for example, to the difference voltage between the fourth and fifth nodes k4, k5 of FIG. 2.

The bias voltage uq' of the bias source bq controls a p-channel transistor t11, which feeds, via an eighth node k8 as a current source, two series-connected diode sections, thus generating a reference voltage u5 for the fixed potential at a node k9. Since the reference voltage u5 is not loadable, an equalizing current ia flowing between the nodes k8 and k9 is compensated by an equally large output current ia' of a one-to-one positive feedback circuit implemented with the two current mirrors m1, m2. The associated current transfer ratios are given in FIG. 3 as numerical values. It can be seen that the transconductance of the transistor t9 must be six times the transconductance of the transistor t10.

The proper starting behavior of the second amplifier v2 of FIG. 3 is not ensured without the second auxiliary signal x2. Without this signal, the direct-current path for the reference voltage u5, for example, would be blocked.

Figure 4:
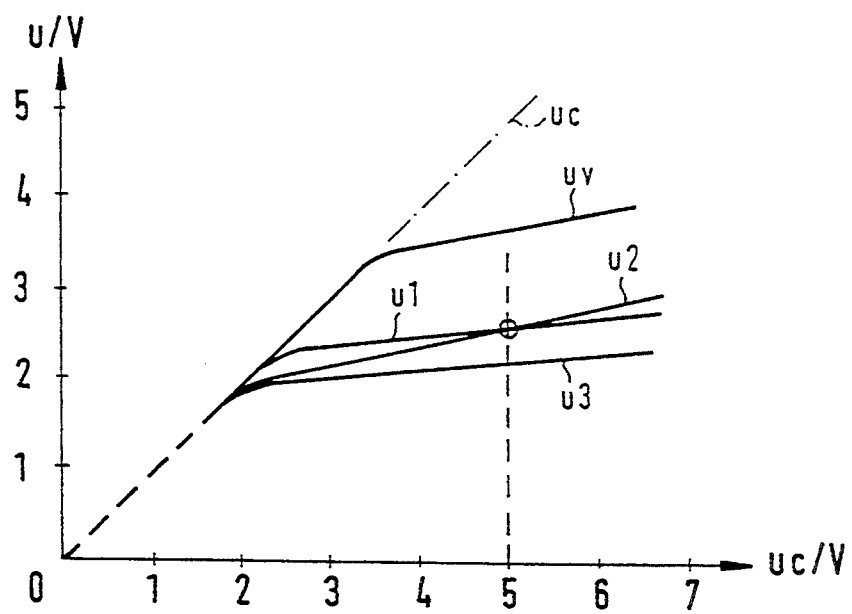
FIG. 4 illustrates schematically a few voltages as a function of the regulated output voltage.

FIG. 4 illustrates a few voltage curves of the embodiment of FIG. 2 in a schematic representation. Up to an ordinate value u of approximately 2.0 volts, the voltages u1, u2 and u3 of the bandgap circuit bg have nearly the same value as the abscissa voltage uc. This means that up to this value, no currents i1 and i2 flow through the resistors r1, r2 and r3, respectively, and the bandgap circuit is inactive. At higher abscissa values uc, an approximately constant difference voltage, which is determined by the area ratio e1/e2 of the emitters according to the above formula, appears between the curves u1 and u3.

The diagram of FIG. 4 also shows the voltage curve u2 at the node k5. In the active region of the bandgap circuit bg, when the abscissa values of the voltages u1, u2 are above 2.5 volts, the voltage curve u1 is less steep than the voltage curve u2. The two voltages intersect at an ordinate value u of approximately 2.7 volts, to which an abscissa value uc of approximately 5 volts is assigned—this is the bandgap output voltage proper, which is the desired value of the regulated supply voltage The diagram of FIG. 4 further includes the voltage curve uv at the node kv. Up to 3.5 volts, the voltage uv is identical with the abscissa value uc, which means that in this range of the voltage, the transistor t6 is in the unsaturated condition and no current iv is flowing in the differential amplifier c, v1. This can be seen more clearly in FIG. 5.

Figure 5:
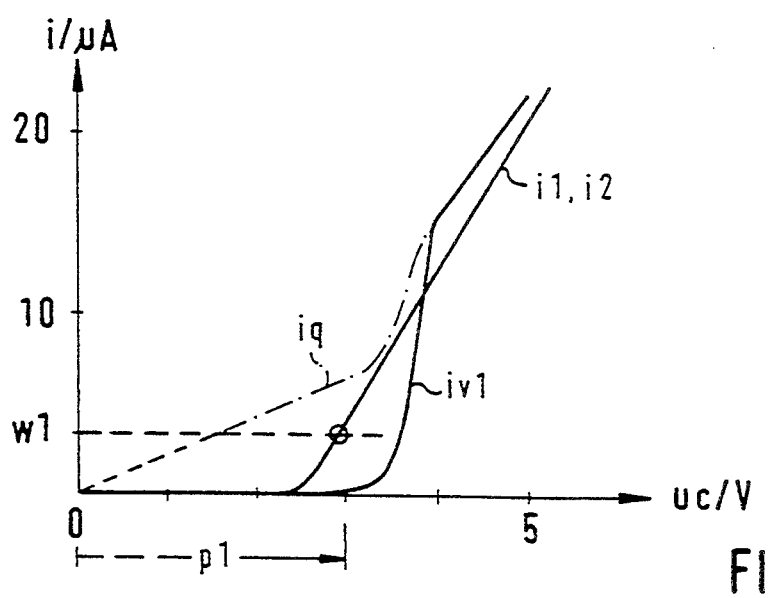
FIGS. 5 and 6 illustrate schematically a few currents as a function of the regulated output voltage.

FIG. 5 illustrates schematically a few current curves of the embodiment of FIG. 2. The currents i1, i2 of the bandgap circuit have the value zero at small voltages uc and increase linearly above a voltage uc of approximately 2.3 volts—this corresponds to the series combination of four base-emitter junctions. In this voltage range uc, the differential amplifier c, v1 is still in the deenergized condition. It only becomes active above a voltage uc of approximately 3.5 volts, so that it can take part of the current iq from the current source q1 as the current iv1. The current is taken not abruptly, but in a transition region which ends at an abscissa value uc of approximately 4 volts. From this voltage value, the whole current iq from the current source is taken by the differential amplifier.

The first switching threshold w1, which monitors one of the shunt currents i1, i2 of the bandgap circuit bg, and thus defines the first starting phase p1, by no means ensures that the differential amplifier c, v1 is in the regular operating range. FIG. 5 shows that in the worst case, the first switching threshold w1 may drop to an abscissa value uc of 2.3 volts, at which the differential amplifier does not yet take any current at all.

Figure 6:
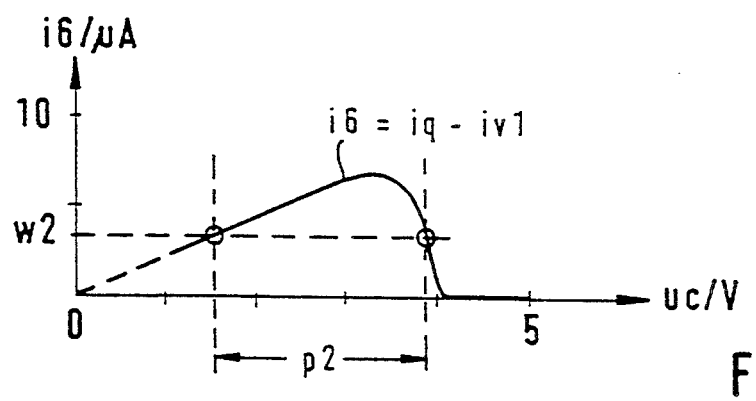

In the schematic diagram of FIG. 6, the differential current i6 of the embodiment of FIG. 2 is plotted as a function of the voltage uc, with i6=iq−iv1. The differential current i6 is supplied to the starting device st and defines via the second switching threshold w2 the second starting phase p2, which ends at an abscissa value uc of approximately 3.8 volts. Since the differential current i6 also drops below the switching threshold w2 at a lower voltage uc, a combination, and thus overlapping, of the first and second starting phases p1, p2 is necessary. This is accomplished in the starting device st of FIG. 2 by adding the currents i4 and i6 in the input of the auxiliary circuit h.

What is claimed is:

1. A series voltage regulator that receives an unregulated input voltage on a first terminal and that generates a regulated supply voltage output on a second terminal, said input voltage and said output voltage being referenced to a reference voltage potential on a third terminal, said series voltage regulator comprising:
   a control loop comprising:
      a reference network;
      a difference device having a first gain; and
      a control element having a second gain, said control element connected between said first terminal and said second terminal;
   a first power supply for said reference network and for said difference device, said first power supply coupled to said second terminal to receive said regulated output voltage;
   a second power supply for said control element, said second power supply coupled to said first terminal to receive said unregulated input voltage; and
   a starting device coupled to an auxiliary circuit, said starting device providing an output signal to said auxiliary circuit during a starting phase to activate said auxiliary circuit, said auxiliary circuit providing an auxiliary signal to said control loop to pull said control loop into a regular operating range so that said control loop causes said regulated output voltage to be controlled toward a desired regulated output voltage during said starting phase.

2. A series voltage regulator as defined in claim 1, further comprising a first sensor that detects a nonregular operating range of said reference network in accordance with a first value sensed by said first sensor, said first sensor coupled to said starting device, said first sensor activating said starting device to define a first starting phase when said first sensor senses that said first value is at a first switching threshold.

3. A voltage regulator as defined in claim 2, further comprising a second sensor that detects a nonregular operating range of said difference device in accordance with a second value sensed by said second sensor, said second sensor coupled to said starting device, said second sensor activating said starting device to define a second starting phase when said second sensor senses that said second value is at a second switching threshold.

4. A voltage regulator as defined in claim 3, wherein said first switching threshold and said second switching threshold are preset so that said first starting phase and said second starting phase together completely cover the nonregular operating range of said control loop.

5. A voltage regulator as defined in claim 3, further comprising a current source for said difference device, said current source having a saturation voltage, and wherein:

said difference device has an operating current;

during said second starting phase, said second sensor supplies a current corresponding to at least a portion of said operating current of said difference device as an activation current to said starting device; and when the saturation voltage of said current source is reached, said activation current supplied to said starting device is transferred to said difference device.

6. A voltage regulator as defined in claim 1, further comprising a sensor that detects a nonregular operating range of said difference device in accordance with a value sensed by said sensor, said sensor coupled to said starting device, said sensor activating said starting device to define a starting phase when said sensor senses that said value is at a switching threshold.

7. A voltage regulator as defined in claim 6, further comprising a current source for said difference device, said current source having a saturation voltage, and wherein:

said difference device has an operating current;

during said starting phase, said sensor supplies a current corresponding to at least a portion of said operating current of said difference device as an activation current to said starting device; and when the saturation voltage of said current source is reached, said activation current supplied to said starting device is transferred to said difference device.

8. A voltage regulator as defined in claim 1, wherein said reference network includes a bandgap circuit.

9. A voltage regulator as defined in claim 1, wherein said control element comprises a transconductance amplifier.

10. A voltage regulator as defined in claim 1, wherein said voltage regulator is fabricated using CMOS technology.

11. A voltage regulator as defined in claim 1, wherein said voltage regulator is a CMOS voltage regulator that includes substrate transistors that are integrated on the same semiconductor surface.

12. A voltage regulator as defined in claim 1, further comprising a signal-processing device, wherein said voltage regulator and said signal-processing device are integrated on a single semiconductor surface, and wherein said signal-processing devices are designed to be fabricated by a process optimized for the value of the regulated supply voltage.

13. A voltage regulator as defined in claim 12, wherein said process is a standard CMOS technology process.

* * * * *